United States Patent [19]

Kang et al.

[11] Patent Number: 4,945,066
[45] Date of Patent: Jul. 31, 1990

[54] PROCESS FOR MANUFACTURING A DYNAMIC RANDOM ACCESS MEMORY CELL

[75] Inventors: Myong-Ku Kang, Seoul; Byong-Hyun Park, Kyoungsangbuk; Won-Hee Jang, Seoul, all of Rep. of Korea

[73] Assignee: SamSung Electronics Co., Ltd., Rep. of Korea

[21] Appl. No.: 159,177

[22] Filed: Feb. 23, 1988

[30] Foreign Application Priority Data

Feb. 24, 1987 [KR] Rep. of Korea ................. 1987-1554

[51] Int. Cl.$^5$ ................. H01L 27/108; H01L 21/265
[52] U.S. Cl. ........................... 437/30; 437/45; 437/47; 437/52
[58] Field of Search ............ 437/27, 28, 29, 41, 437/45, 47, 52, 30; 357/23.6

[56] References Cited

U.S. PATENT DOCUMENTS

| | | | |
|---|---|---|---|
| 4,240,092 | 12/1980 | Kuo | 357/23.6 |
| 4,352,236 | 10/1982 | McCollum | 437/52 |
| 4,366,613 | 1/1983 | Ogura et al. | 437/30 |
| 4,413,401 | 11/1983 | Klein et al. | 357/23.6 |
| 4,536,947 | 8/1985 | Bohr et al. | 156/643 |
| 4,702,797 | 10/1987 | Shimano et al. | 156/643 |
| 4,751,557 | 6/1988 | Sunami et al. | 357/23.6 |
| 4,763,181 | 8/1988 | Tasch, Jr. | 357/23.6 |

Primary Examiner—Olik Chaudhuri
Attorney, Agent, or Firm—Robert E. Bushnell

[57] ABSTRACT

A process for manufacturing a dynamic random access memory (DRAM) cell wherein an improvement is made in an occurrence of soft errors in operation of a memory device, said soft errors resulting from alpha particles being produced from uranium-series materials included in fabricating materials during fabrication of memory chips, especially in the package of the chip. In a single transistor memory cell, through forming boron layers below a storage capacitor region and below a drain region of the transistor coupled with a bit line, a barrier is formed against the minority carriers resulting from the alpha particles within the substrate. Also, through enlarging the storage capacitor region toward a field oxide layer just around the capacitor perimeter, a capacitance of the storage capacitor is increased so that the influence of the soft errors is negligible.

19 Claims, 3 Drawing Sheets

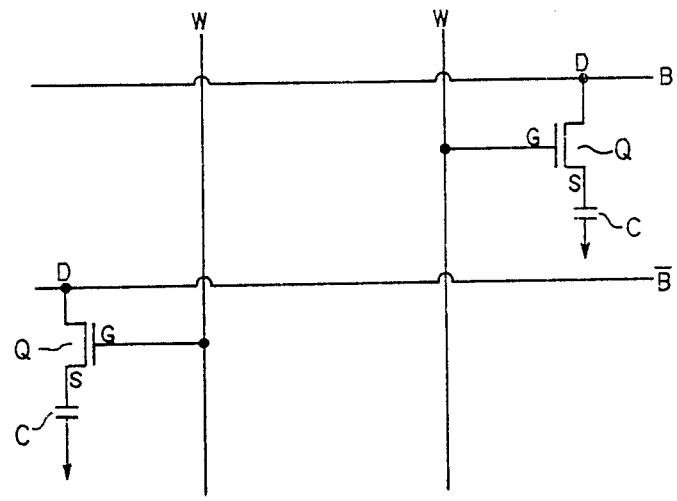
F I G . 1
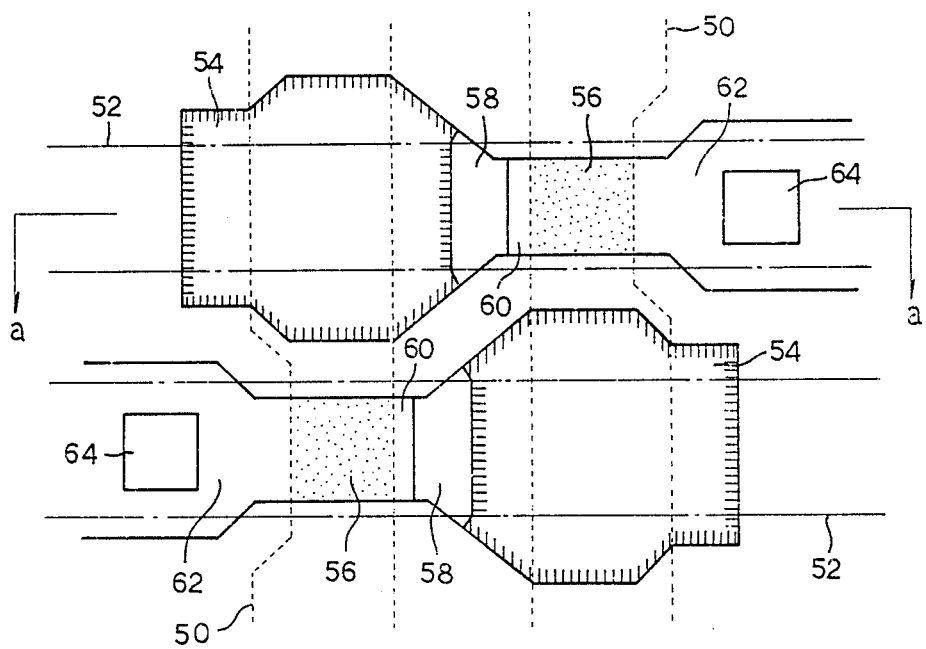
F I G . 2

PROCESS FOR MANUFACTURING A DYNAMIC RANDOM ACCESS MEMORY CELL

BACKGROUND OF THE INVENTION

This invention relates to a process for manufacturing a dynamic random access memory (DRAM) cell, and more particularly to such a process for manufacturing a DRAM cell wherein each DRAM cell is formed of a single transistor and a single capacitive storage device, and has a high capacitance.

In a large-scale integrated DRAM, a memory cell having a combination of a single transistor coupled with a single capacitive device has been widely used, and the combination is referred to as a "single transistor cell" for which a folded bit line array is employed as illustrated in FIG. 1 showing a schematic circuit diagram of a single transistor DRAM cell array. Referring to the FIG. 1, a transistor Q is a NMOS transistor, a bit line B is connected to a drain D of the transistor, a word line W is connected to a gate G of the transistor, a source of the transistor is connected to a storage capacitor C, and the other side of the capacitor is coupled to a silicon substrate.

Referring to FIG. 2, a plan view showing the layout according to the circuit configuration of FIG. 1, the word line W represents a second polysilicon strip 50, the bit line B represents a metal strip 52 formed of aluminium and so on, a region 54 is a first polysilicon region for a storage capacitor and a region 60 is a N+ source region formed by an ion implantation of N-type impurities, said source region connecting with a conductive layer under the first polysilicon region 54 by way of a conductive layer below a mini-field oxide region 58. A region 62 is a drain region formed by an ion implantation of N-type impurities, a region 56 is a gate region wherein a gate oxide is formed under the second polysilicon region and a portion under the oxide becomes a channel layer, and a window 64 is a metal-silicon connecting part for coupling the drain 62 and the bit line 52. In prior art, the mini-field oxide layer 58 is formed at the same time that a surface insulating layer of the first polysilicon region 54 overlapped in the upper part of the capacitive region is formed, and arsenic (As) of an arsenic ion implantation layer in a silicon substrate surface below the storage capacitor region, which becomes an electrode of the storage capacitor, is diffused through a side diffusion into a silicon substrate surface below the mini-field oxide layer. By using these facts, a method of the prior art has been widely employed in which said source of the transistor and said arsenic ion implantation layer are coupled to each other.

In making use of this processing method as mentioned above, when forming a mini-field oxide layer, the arsenic ion-implanted in the silicon substrate surface often fails to be diffused enough into the connecting part of the mini-field oxide layer and the source region of the transistor due to its low diffusion factor. Also, a decrease in the arsenic ion density arising from an out diffusion results in a high resistance between the capacitor and the transistor. Thus due to said decrease, a margin of supply voltage to a DRAM is reduced and refresh time is rapidly decreased, thereby resulting in an inability to perform a high-speed operation. Moreover, in the worst case, an open circuit in the connection between said capacitor and transistor often makes the manufacture of an entire chip a failure.

Another problem is that there is increased possibility of a soft-error occurrence, wherein data "1" stored in the capacitor is changed into data "0" because the amount of electric charge is reduced in a storage region of minority carriers resulting from α(Alpha) particles which are generated from uranium-group substances of fabrication materials of memory chips, as a cell area and an electric charging amount stored in a cell are both reduced accommodate the density of to a large intergrated circuit of semiconductor memory devices. Another problem in the prior art is that there is also an increased a possibility of a soft-error occurrence by which the data "0" reads out to be the data "1", because, as the minority carriers generated by the α particle move to the N+ drain region of a transistor, the electric potential in a bit line goes down.

SUMMARY OF THE INVENTION

It is therefore an object of the invention to provide an improved process for manufacturing a dynamic random access memory cell. It is also an object to provide a process for manufacturing a dynamic random access memory cell which effectively couples an electrode of a storage capacitor with a source region of a transistor in spite of having mini-field oxide layer and, also decreases a resistance between the electrode of the storage capacitor and the source region of the transistor.

It is another object of the invention to provide a process for manufacturing a single transistor memory cell which has a high capacitive storage device not influenced by storage of minority carriers generated by α particles and which has a structure in which the minority carriers can not influence a read-out of information in a bit line.

To achieve the above described objects of the invention, the process comprises the steps of:

(1) ion implanting boron for forming a channel stopping region;

(2) forming a field oxide for isolating each cell;

(3) ion implanting phosphorus for coupling a lower electrode of a storage capacitor with a source region of a transistor below a mini-field;

(4) etching an edging part of said field oxide layer just around the capacitor perimeter in order to form a high capacitive storage capacitor, thereby enlarging an area of the storage capacitor, and ion implanting boron for forming a barrier against minority carriers resulting from alpha particles;

(5) coating an etched portion of said storage capacitor with an oxidation insulating film and ion implanting arsenic ions for forming the lower electrode of the storage capacitor;

(6) forming a polysilicon electrode of said storage capacitor over said insulating film;

(7) forming a thick oxidation insulating film for insulating a portion in which a word line is formed over said polysilicon electrode;

(8) forming the word line over said insulating film, and both a source and drain of a transistor;

(9) forming a protective layer over said word line and, also forming a barrier against minority carriers moving below a bit line by means of opening a window for coupling the bit line to the drain of said transistor and then ion implanting boron through said opened window; and

(10) forming said bit line over said protective layer.

BRIEF DESCRIPTION OF THE DRAWINGS

The features and advantages of the process according to the invention will now be explained hereinafter with reference to the accompanying drawings wherein:

FIG. 1 is a schematic circuit diagram of a single transistor DRAM cell array;

FIG. 2 is a plan view for the layout of the single transistor DRAM cell array.

DETAILED DESCRIPTION OF THE INVENTION

FIGS. 3A to 3J are cross sectional views taken through a cutting position a-a shown in FIG. 2 in a plate-shaped semiconductor body, showing each aspect of manufacturing the single transistor memory cell in accordance with the invention. A starting material is a P-type single crystal silicon substrate, wherein there is used a wafer more than 5 inches in diameter having an impurity density of $7 \times 10^{14}$–$3 \times 10^{15}$/cm$^3$ and a <100> direction in crystal lattice orientation.

Figures 3A, 3B, 3C, 3D, 3E:
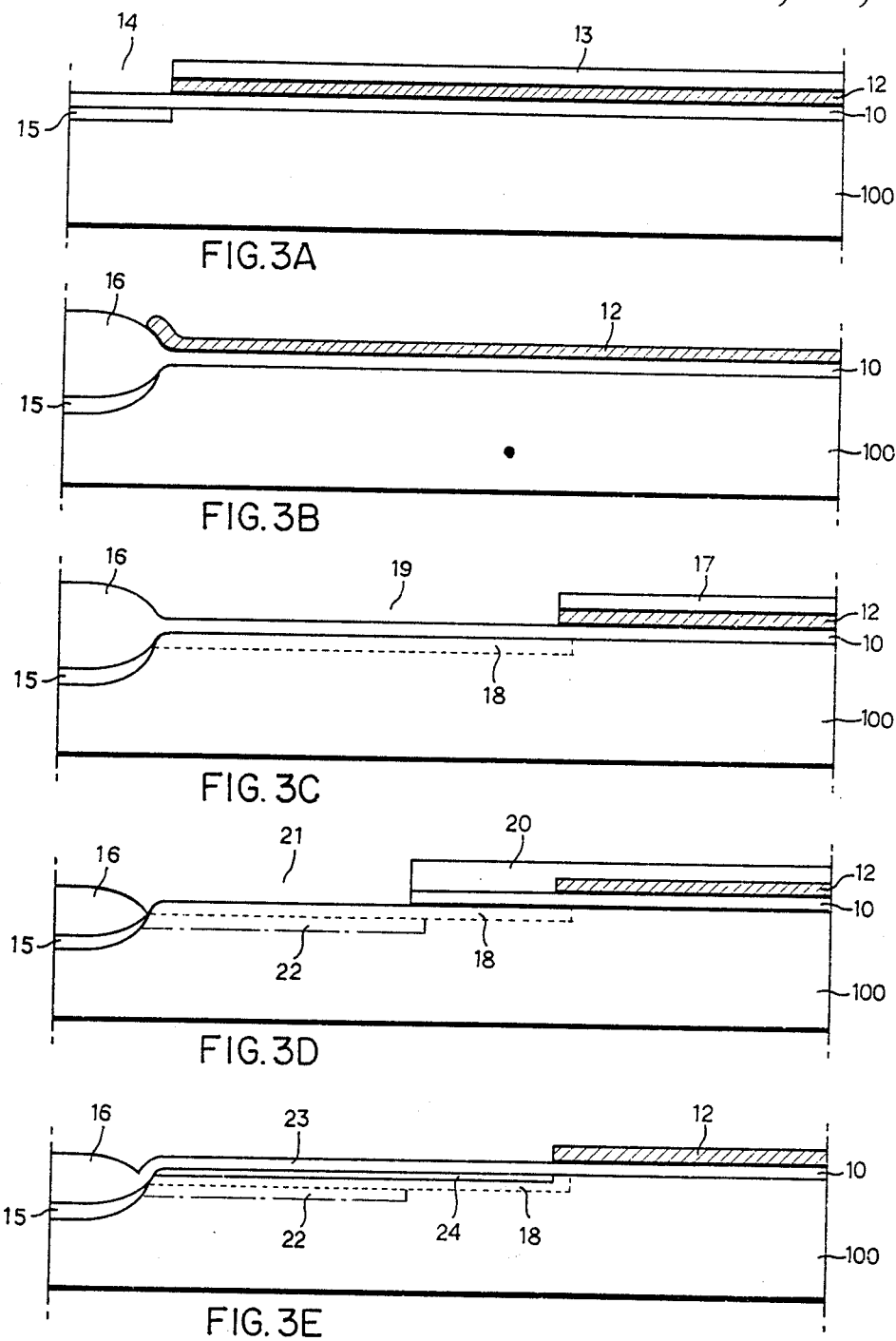
FIGS. 3A to 3J are partial cross-sectional views showing each stage of manufacturing the single transistor memory cell in accordance with the invention.

According to FIG. 3A showing a fabrication sequence for forming an oxide and a nitride on a surface of silicon substrate 100 and performing ion implantation for forming a channel stopping layer, there is at first formed a silicon oxide layer 10 having a thickness of 150–500Å on the whole surface by means of a heat oxidation with a temperature of 950°–1050° C., after rinsing the P-type silicon substrate 100. A silicon nitride layer 12 having a thickness of 1000–1500Å is formed over all the oxide layer 10 in the ambient environment of Dichlorosilane (SiH2C12) and Ammonia (NH3) of a reactor, and a photoresist 13 is then coated over the silicon nitride layer. It is now exposed to an ultra violet light through a mask which forms a pattern for a thick field oxide area 16 and a P+ channel stop 15. Then the photoresist 13 is developed and, by etching the silicon nitride layer 12, there is exposed the silicon oxide layer 10. After this processing, to form the channel stop area by employing as a mask the photoresist layer 13 and the silicon nitride layer 12, there is performed an ion implantation of boron by means of an energy of 30–80 keV and a dose of $10^{12}$–$10^{13}$/cm$^2$.

FIG. 3B shows a fabrication sequence for forming a field oxide layer 16 used to isolate each cell. At first, there is removed the photoresist layer 13 and then formed the field oxide layer 16 having a thickness of 5000–6000Å in a steam or oxidation ambient environment and at a temperature of 900°–1000° C. At this time, the oxide layer 10 does not grow due to a masking effect of the silicon nitride layer 12.

FIG. 3C shows a fabrication sequence of phosphorus ion implantation for coupling a lower electrode of a storage capacitor and a source area of a transistor below a mini-field, in which photoresist is coated, then exposed to the ultraviolet light through a masking material and further developed. After etching the silicon nitride in an area 19, an ion implantation of phosphorus ions is performed into the area 19 with an energy of 30–50 keV and a dose of $10^{13}$–$10^{14}$/cm$^2$ by means of employing as a mask the silicon nitride 12 and photoresist 17 to form coupling 18. After performing the ion implantation, remaining photo resist is removed.

FIG. 3D shows a fabrication sequence in which there is etched an edge part of the field oxide layer 16 just around the capacitor perimeter in order to form a high capacitive storage capacitor and boron is ion-implanted. To make an area 21, photoresist is coated, then exposed to the ultraviolet light through a mask and developed. The exposed field oxide layer 16 and oxide layer 10 is etched for a time of 20–60 seconds at a temperature of 20°–30° C. in a diluted solution having a mixing ratio of Hydrofluoric acid (HF) to Deionized water (D.I. water) is 1:7. Then, an ion implantation of boron ions is performed with an energy of 50–150 keV and a dose $5.0 \times 10^{12}$–$10^{14}$/cm$^2$ by means of employing the photoresist 20 as a mask to form barrier 22 against minority carrier resulting from alpha particles. By this process, the edge of said field oxide layer 16 is etched and the area of the storage capacitance enlarged, whereby capacitance of the storage capacitor is enlarged by 10–15% more than that of the prior art.

FIG. 3E represents a fabrication sequence in which an oxide layer 23 is formed on an etched portion 21 of the storage capacitor and a lower electrode of the storage capacitor is formed. An oxide silicon layer 23 is at first formed in said etched portion 21 by using thermal oxidation and then an ion implantation of arsenic ions is performed to form a lower electrode 24 with an energy of 70–120 keV and a dose of $3 \times 10^{13}$–$3 \times 10^{14}$/cm$^2$.

Figure 3F:
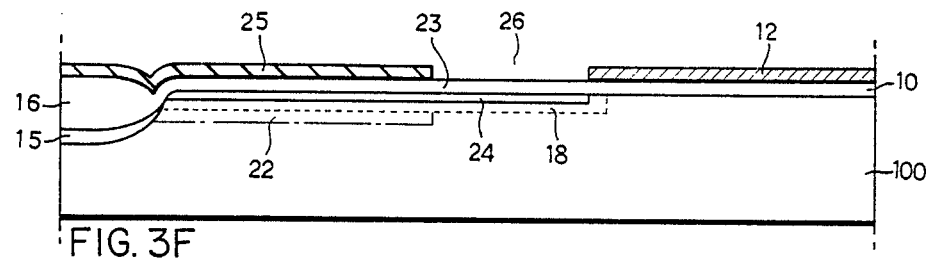

FIG. 3F represents a fabrication step for a first polysilicon electrode 25 of the storage capacitor over said insulating layer 23. The polysilicon is at first coated over all the surface of the substrate in a thickness of 4000–6000Å within the reactor by means of a conventional processing method in the art and then deposited in a phosphorus oxychloride (POC13). After doping impurites so as to have a resistance of 20–80Ω/square, there is coated a photoresist over all the surface of substrate. Then, using a photo lithography process, all the polysilicon is etched except for a portion to form gate 25 of the storage capacitor of the cell array and the remaining photoresist is removed.

Figure 3G:
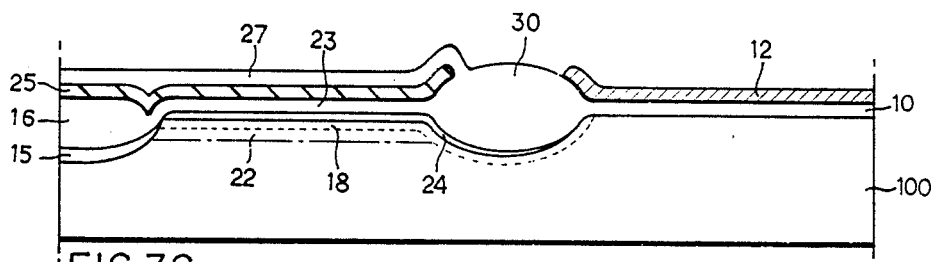

FIG. 3G is a fabrication step in which a thick oxide silicon layer is grown over the first polysilicon layer 25 for insulating a second polysilicon layer. At first, a silicon oxide layer 27 is grown in the thickness of 2500–4500Å at a temperature of 900°–1000° C. using the thermal oxidation, and then the remaining silicon nitride layer 12 is all etched. When growing the silicon oxide layer 27, there is formed a mini-field oxide layer 30, and the phosphorus or arsenic ion-implanted below the mini-field oxide layer is annealed by the thermal oxidation and simultaneously diffused. Therefore, a bird beak portion of the mini-field 30 is completely covered with phosphorus having a double side diffusion factor more than that of arsenic. In order to control a threshold voltage of an enhancement MOS transistor, boron ion implantation is performed on all the surface oxide, and in order to control a threshold voltage of a depletion MOS transistor, ion implantation of phosphorus or arsenic is performed.

Figure 3H:
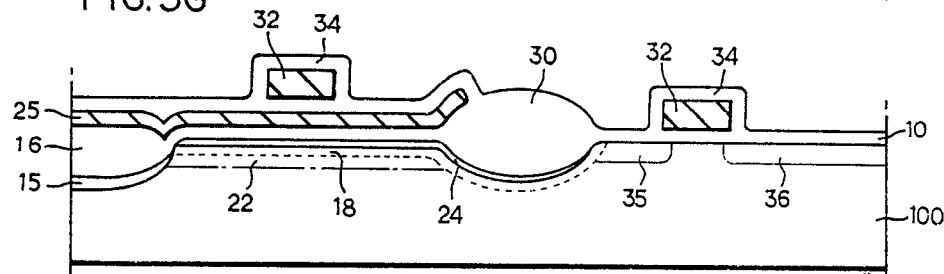

FIG. 3H is a fabrication step in which a second polysilicon layer for forming a gate electrode and a word of a MOS transistor is formed over said oxide layer, and arsenic ion-implantation is performed in order to form a drain area and a source area of the transistor. At first, the second polysilicon layer 32 is coated over all the surface of said insulating layer by means of the conventional processing method and, then deposited in the POC13 and doped with impurities. After these steps, there is coated a photoresist over all the surface of the substrate, a word line 32 is formed by using the photo lithography process and then ion-implanted with arsenic in order to form a source and a drain of the transistor. Over the second polysilicon layer 32, an oxide layer having a thickness of 1000–2500Å is grown by thermal oxidation. When forming oxide layer 34, a diffusion of the arsenic ions implanted arises and, by this diffusion, there is formed source and drain area of the transistor.

Figure 3I:
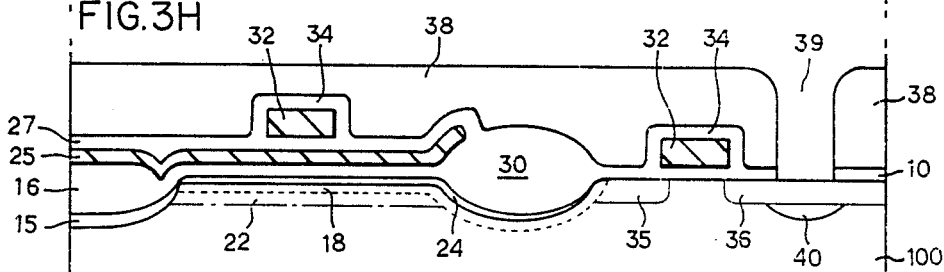

FIG. 3I is a fabrication step in which a passivation layer 38 is formed over the surface of the substrate formed through the aforementioned sequences and a barrier 40 against minority carriers resulting from alpha particles is also formed under the drain area 36. Interlayer oxide 38 which consists of Phospho Silicate Glass (PSG) or Borophospho silicate Glass (BPSG) covers all of the surface of the substrate shown in FIG. 3H by means of the conventional processing method. Then, after coating a photoresist on the surface, on which a window 39 is developed using photoresist and oxide etching for the formation of contact between a bit line and drain region by using the photo lithography method and the etch method. In the next step, there is performed ion implantation of boron having an identical conductivity type to the substrate with an energy of 150–180 keV and a dose of $5 \times 10^{12} - 5 \times 10^{13}/cm^2$ without a separate etching process or a mask on all the surface of substrate. In this fabrication stage, the boron ions are not deeply implanted into the area of the interlayer oxide, but they are deeply ion-implanted into the below part of the drain region 36 for the preparation of a region in which with boron ion implantations, a barrier is formed for retarding an injection of electrons generated from the substrate by α-particles.

Figure 3J:
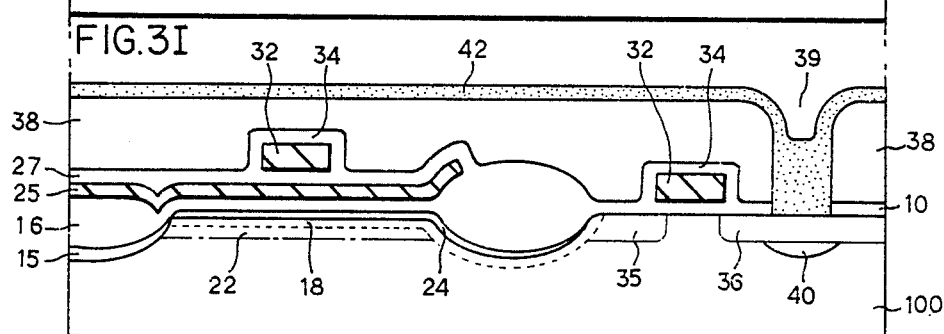

FIG. 3J represents a fabrication step for forming a bit line 42 of aluminium over the passivation layer 38.

As aforementioned, as arsenic and the impurities of a conductivity type identical to said phosphorus having a larger diffusion factor than arsenic are ion-implanted, the connection with the source area is efficiently performed owing to the side diffusion of said impurities when forming the surface oxide of the first polysilicon layer. Moreover, a margin of supply voltage and a refresh time in a DRAM device can be increased by reducing a resistance in a lower part of the mini-field oxide layer, and a capacitance of the storage capacitor can be enlarged by etching the edge part of the field oxide layer just around the capacitor perimeter. In addition to the above, as the ion implantation of boron is performed below the arsenic and phosphorus layer under the capacitor region, a barrier is formed against the minority carriers resulting from the alpha particles of the uranium group, thereby preventing a loss of an electric charge quantity in storage due to the minority carriers induced from the substrate, which consequently keeps data stored in the capacitor from being changed from "1" to "0". As a barrier is also made to the minority carriers resulting from the alpha particles by means of ion implanting boron below the drain region of the transistor in contact with the bit line, there is effectively reduced a soft error rate in a bit line in which data "0" could be read out to be data "1" when detecting the information because an electric potential of the bit line goes down resulting from the minority carriers injected into the under side of the bit line.

While the invention has been particularly shown and described with reference to a preferred embodiment, it will be understood by those skilled in the art that modifications in detail may be made therein without departing from the spirit and scope of the invention as claimed.

What is claimed is:

1. A process for manufacturing a dynamic random access memory cell, comprising the sequential steps of:
   (1) forming a first oxide layer and a silicon nitride layer over a surface of silicon substrate and ion implanting boron for forming a channel stopping region;
   (2) forming a field oxide layer for isolating each cell over said channel stopping region;
   (3) ion implanting phosphorus for forming a coupling region connecting a lower electrode of a storage capacitor with a source region of a transistor;
   (4) etching an edge part of said field oxide layer just around a perimeter of said storage capacitor with a diluted solution of hydrofluoric acid to increase capacitance of said storage capacitor by enlarging an area of the storage capacitor, and ion implanting boron for forming a first barrier to prevent a collection of minority carriers resulting from alpha particles under the storage capacitor;
   (5) growing a second oxide layer over an etched area of the storage capacitor and ion implanting arsenic for forming said lower electrode of the storage capacitor;
   (6) forming a first polysilicon layer over said second oxide layer to serve as a second electrode of said storage capacitor;
   (7) forming a thick oxide layer over said first polysilicon layer and, after removing all remaining of said silicon nitride layer, doping impurities in all the surface of the substrate in order to control threshold voltage;
   (8) forming a second polysilicon layer to serve as a gate electrode of the transistor and a word line over the first oxide layer, and forming a source and drain region of the transistor;
   (9) forming an interlayer of oxide over the substrate, forming a window for coupling a bit line to the drain of said transistor and then ion implanting boron through said window to form a second barrier against minority carriers below the drain region of the transistor; and
   (10) forming the bit line over said interlayer.

2. The process of claim 1, further comprised of diffusing said phosphorus while forming said thick oxide layer.

3. The process of claim 1, further comprised of doping said source and drain region with arsenic after forming said second polysilicon layer, and diffusing arsenic within said source and drain region while growing a third oxide layer over said second polysilicon layer.

4. The process of claim 2, further comprised of doping said source and drain region with arsenic after forming said second polysilicon layer, and diffusing arsenic within said source and drain region while growing a third oxide layer over said second polysilicon layer.

5. The process of claim 1, further comprised of disposing said coupling region formed by said phosphorus between said first barrier and said lower electrode.

6. The process of claim 2, further comprised of disposing said coupling region formed by said phosphorus between said first barrier and said lower electrode.

7. The process of claim 3, further comprised of disposing said coupling region formed by said phosphorus between said first barrier and said lower electrode.

8. The process of claim 4, further comprised of disposing said coupling region formed by said phosphorus between said first barrier and said lower electrode.

9. The process of claim 1, further comprised of forming said first barrier to extend substantially coextensively with said second oxide layer.

10. The process of claim 5, further comprised of forming said first barrier to extend substantially coextensively with said second oxide layer.

11. A process for manufacturing an integrated circuit semiconductor device, comprising the steps of:
 forming a first oxide layer over a surface of a silicon substrate;
 ion implanting phosphorus to form a coupling region connecting a lower electrode of a storage capacitor and a source region of a transistor;
 ion implanting boron to form a first barrier beneath the storage capacitor to prevent collection of minority carriers resulting from alpha particles;
 growing a second oxide layer substantially coextensive with the first barrier;
 ion implanting arsenic to form said lower electrode of the storage capacitor disposed substantially coextensively with and above said coupling region and in electrical contact with said coupling region;
 forming a first polysilicon layer over said second oxide layer to serve as a second electrode of said storage capacitor;
 forming a thick oxide layer over said first polysilicon layer;
 forming a second polysilicon layer over said first oxide layer to serve as a word line and gate electrode of the transistor; then
 forming said source and a drain regions of the transistor within the substrate; and
 forming an interlayer of oxide over the substrate, forming a window through the interlayer for coupling a bit line to the drain of the transistor, and ion implanting boron through said window to form a second barrier against minority carriers below the drain region of the transistor; and
 forming the bit line over the interlayer.

12. The process of claim 11, further comprised of diffusing said phosphorus while forming said thick oxide layer.

13. The process of claim 11, further comprised of doping said source and drain region with arsenic after forming said second polysilicon layer, and diffusing arsenic within said source and drain region while growing a third oxide layer over said second polysilicon layer.

14. The process of claim 13, further comprised of diffusing said phosphorus while forming said thick oxide layer.

15. The process of claim 11, further comprised of disposing said coupling region between said first barrier and said lower electrode.

16. The process of claim 14, further comprised of disposing said coupling region between said first barrier and said lower electrode.

17. A process for manufacturing a dynamic random access memory cell, comprising the sequential steps of:
 forming a field oxide layer for isolating each cell over a channel stopping region;
 ion implanting phosphorus for coupling a lower electrode of a storage capacitor with a source region of a transistor;
 etching an edge part of said field oxide layer just around a perimeter of said storage capacitor to increase capacitance of said storage capacitor by enlarging an area of the storage capacitor, and ion implanting boron for forming a first barrier to prevent a collection of minority carriers resulting from alpha particles under the storage capacitor;
 growing a second oxide layer over an etched area of the storage capacitor and ion implanting arsenic for forming said lower electrode of the storage capacitor;
 forming a first polysilicon layer over said second oxide layer to serve as a second electrode of said storage capacitor;
 forming a thick oxide layer over said first polysilicon layer;
 forming a second polysilicon layer to serve as a gate electrode of the transistor and a word line over the first oxide layer, and forming the source and drain regions of the transistor; and
 forming an interlayer of oxide over the substrate, forming a window for coupling a bit line to the drain of said transistor and then ion implanting boron through said window to form a second barrier against minority carriers below the drain region of the transistor.

18. The process of claim 17, further comprised of disposing said coupling region formed by said phosphorus between said first barrier and said lower electrode.

19. The process of claim 17, further comprised of forming said first barrier to extend substantially coextensively with said second oxide layer.

* * * * *